(12) United States Patent
Ejeckam et al.

(10) Patent No.: US 10,374,553 B2
(45) Date of Patent: Aug. 6, 2019

(54) MICROWAVE TRANSMITTER WITH IMPROVED INFORMATION THROUGHPUT

(71) Applicant: Akash Systems, Inc., San Francisco, CA (US)

(72) Inventors: Felix Ejeckam, San Francisco, CA (US); Tyrone D Mitchell, Jr., Libertyville, IL (US); Paul Saunier, Dallas, TX (US)

(73) Assignee: Akash Systems, Inc., San Francisco, CA (US)

( * ) Notice: Subject to any disclaimer, the term of this patent is extended or adjusted under 35 U.S.C. 154(b) by 0 days.

(21) Appl. No.: 15/624,468

(22) Filed: Jun. 15, 2017

(65) Prior Publication Data

US 2018/0367100 A1 Dec. 20, 2018

(51) Int. Cl.
*H01L 29/778* (2006.01)
*H03F 1/02* (2006.01)
(Continued)

(52) U.S. Cl.
CPC ............ *H03F 1/0205* (2013.01); *H01L 23/66* (2013.01); *H01L 29/778* (2013.01); *H03F 3/195* (2013.01); *H03F 3/213* (2013.01); *H03F 3/245* (2013.01); *H01L 29/2003* (2013.01); *H01L 29/7786* (2013.01); *H01L 2223/6683* (2013.01); *H01L 2224/48091* (2013.01); *H03F 2200/451* (2013.01)

(58) Field of Classification Search
CPC ............. H01L 2223/6683; H01L 23/66; H01L 29/2003; H01L 29/778; H03F 1/0205; H03F 3/195

USPC .......................................................... 257/770
See application file for complete search history.

(56) References Cited

U.S. PATENT DOCUMENTS 5,428,504 A 6/1995 Bhatla et al.
6,451,633 B1 * 9/2002 Yoshida ................ H01L 21/743
257/E21.415

(Continued)

OTHER PUBLICATIONS

Ejeckam, et al. "3,000+ Hours continuous operation of GaN-on-Diamond HEMTs at 350° C. channel temperature", 30th Annual Semiconductor Thermal Measurement and Management Symposium (SEMI-THERM) in 2014.

(Continued)

*Primary Examiner* — Long K Tran
(74) *Attorney, Agent, or Firm* — Wilson Sonsini Goodrich & Rosati

(57) ABSTRACT

An RF amplifier module comprises a package having a package base, at least one RF amplifier chip attached to the package base, and an RF power combiner chip attached to the package base. The RF amplifier chip comprises a substrate and at least one transistor disposed on an epilayer overlying the substrate. The substrate comprises a first layer of synthetic diamond characterized by an average value of thermal conductivity.

An RF amplifier module comprises a package having a package base, at least one RF amplifier chip attached to the package base, and an RF power combiner chip attached to the package base. The RF amplifier chip comprises a substrate and at least one transistor disposed on an epilayer overlying the substrate. A first layer of synthetic diamond is at least partially disposed on top of the electronic device.

20 Claims, 7 Drawing Sheets

(51) Int. Cl.
*H03F 3/195* (2006.01)
*H03F 3/213* (2006.01)
*H01L 23/66* (2006.01)
*H03F 3/24* (2006.01)
*H01L 29/20* (2006.01)

(56) References Cited

U.S. PATENT DOCUMENTS

| | | | |
|---|---|---|---|
| 7,595,507 | B2 | 9/2009 | Francis et al. |
| 8,283,672 | B2 | 10/2012 | Francis |
| 8,350,295 | B1 | 1/2013 | Saunier et al. |
| 8,759,134 | B2 | 6/2014 | Ejeckam |
| 8,945,966 | B2 | 2/2015 | Francis et al. |
| 9,150,313 | B2 | 10/2015 | Puig-Suari et al. |
| 9,738,403 | B1 | 8/2017 | Augenstein |
| 9,774,301 | B1 * | 9/2017 | Maalouf ........... H01L 23/49838 |
| 2003/0183368 | A1 * | 10/2003 | Paradis ................ F28F 3/04 165/80.3 |
| 2006/0170004 | A1 * | 8/2006 | Toyoda .............. H01L 29/0692 257/197 |
| 2006/0261471 | A1 * | 11/2006 | Kikushima ........ H01L 23/3128 257/723 |
| 2008/0136514 | A1 * | 6/2008 | Behzad ............... H03F 3/195 330/126 |
| 2010/0045385 | A1 * | 2/2010 | Pengelly ............... H03F 1/0266 330/295 |
| 2011/0064105 | A1 | 3/2011 | Saxier |
| 2012/0105149 | A1 * | 5/2012 | Saiz ........................ H03F 3/211 330/124 R |
| 2015/0187924 | A1 * | 7/2015 | Dasgupta .......... H01L 21/30617 257/76 |
| 2015/0222087 | A1 * | 8/2015 | Williams .............. C23C 16/274 428/64.1 |
| 2015/0303881 | A1 * | 10/2015 | Blednov ................ H03F 3/213 330/289 |
| 2016/0091608 | A1 | 3/2016 | Robinson et al. |
| 2016/0111774 | A1 | 4/2016 | Platzer et al. |
| 2016/0308010 | A1 | 10/2016 | Viswanathan |
| 2017/0170094 | A1 | 6/2017 | Maples |
| 2018/0123520 | A1 * | 5/2018 | Szymanowski ..... H01L 21/4825 |
| 2018/0269130 | A1 | 9/2018 | Ejeckam et al. |

OTHER PUBLICATIONS

U.S. Appl. No. 15/463,390 Office Action dated Jan. 11, 2018.
U.S. Appl. No. 15/463,390 Office Action dated Jul. 30, 2018.
U.S. Appl. No. 15/463,390 Notice of Allowance dated Feb. 7, 2019.

* cited by examiner

MICROWAVE TRANSMITTER WITH IMPROVED INFORMATION THROUGHPUT

FIELD OF INVENTION

This application is directed towards the general fiels of high-power systems for communication between land, space, and airborne entities, and more particularly towards the design of high-power communication transmitters employing RF signal amplification.

BACKGROUND

The nineteen-forties gave birth to information theory. Claude Shannon and co-workers showed that the bandwidth of a transmission channel and its signal-to-noise ratio are not the only parameters to be optimized in order to transmit data without errors but that coding can be used to improve the bit-error ratio in transmission. Efficient coding algorithms became the goal of many a communication systems designer in the last eighty years, and this has resulted in a dramatic increase in bandwidth efficiency of modulation used in microwave communications today: from less than 1 bit/s/Hz to 30 bits/s/Hz for 4G cellular technology. In order to maintain transmission at a high aggregate data rate over appreciable distance, the signal-to-noise ratio has to remain large. The Shannon-Hartley theorem states that the maximum information transfer rate (channel capacity) in the presence of noise is given by $$C = B\log_2\left(1 + \frac{S}{N}\right) \quad (1)$$

where S/N is the signal-noise ratio and B is the channel analog bandwidth. It is clear that no matter how good the coding is, for a given channel bandwidth, the channel capacity depends on the signal to noise ratio. This ratio is limited by the maximum practical power a transmitter can emit on the high end of the signal power and the receiver sensitivity and distance of propagation on the low end. The receiver sensitivity is determined by input device noise figure and the received in-band noise which depends on the bandwidth of the receiver. The end points have generally been set by government bodies and adjusted with the advent of technology. There are numerous applications where the upper power limit is not regulated, but rather determined by required distance of propagation and required bandwidth or often by practicality. This is the case with systems intended to emit signals over large distances and with aerospace applications. In these applications, amplifier output powers can range from kilowatts to hundreds of kilowatts. The design of RF and microwave transmitters delivering such powers presents a challenge.

Solid-state amplifiers use transistors of achieve high RF output powers, the device of choice is the heterojunction field-effect transistor (HFET), which is often referred to as high-electron-mobility transistor (HEMT). It would be ideal if one could manufacture a 10-kW amplifier with only one chip. This is not possible because of a number of practical limitations. Transistors are semiconductor devices that come built on semiconductor chips which are generally small—their sizes measure in millimeters and centimeters at most. Besides the size, which limits the thermal dissipation, there are other reasons: the maximum RF power that can be emitted from a field-effect transistor (FET) is determined by its breakdown voltage VBR and its current carrying capability. For a given technology and epilayer design, the breakdown voltage reduces with the operation frequency and hence the only way to arbitrarily increase the output power (the product of voltage and current) is to increase the transistor current. The drain-to-source current density [A/mm], on the other hand, is determined by epilayer design and technology. With the current density (A/mm) and operation voltage set, the only free parameter that can be used to increase the transistor output power is the transistor periphery. The transistor periphery is a measure of effective gate width perpendicular to the current flow.

The following is a discussion of the options a designer has in designing a high power solid-state amplifier using transistors, specifically, high-electron mobility transistors (HEMTs). Transistor is an electronic device built on top of semiconductor layers, the body of a transistor includes both the semiconductor layer design and the top surface geometry which includes metal layers, contacts and passivation. When one semiconductor chip contains one transistor, it is often referred to as a discrete component and the chip most often have a rectangular shape elongated in direction that is perpendicular to the flow of the RF signal and hence are often referred to as transistor bars. The width of the transistor on the chip determines the transistor bar length. In this specification, the longer dimension of the transistor chip bar is referred to as the transistor bar width. When semiconductor chips contain multiple electronic devices on the same chip, such as passive matching elements, dividers, driver circuits with more transistors in addition to one or more high power RF transistors, this part is referred to as a monolithically integrated microwave circuit (MMIC) with an amplifier. The MMIC chip width is the dimension of the MMIC chip along a direction that is perpendicular to the direction of the RF signal across the output power transistor in the MMIC. The shape of the output transistor and design rules discussed below are the same for transistor chip bars and amplifier MMIC chips.

In practical RF power transistors, the periphery is broken into an integer number of segments. The number of segments is often referred to as the number of gate fingers (F) and the length of each segment is referred to as unit gate width (W). The periphery of a transistor is then defined by P=F·W. High power RF transistors in standalone form or in a microwave monolithically integrated circuit (MMIC) are built in an elongated design in which the unit-gate fingers are disposed in a periodic fashion with their direction perpendicular to the direction of the RF signal as it is well known in the art. The RF power direction is parallel to the gate fingers and inasmuch as their length presents a phase delay of the RF signal, the desired frequency of operation sets the maximum gate width (W~100 μm for X-band or W~50 μm for Ka-band). This leaves only the number of fingers F as the parameter determining the RF transistor power. The width of the RF transistor pattern or chip is determined by the average gate-finger pitch S and the number of fingers F. The width of the transistor on any chip is at least F·S. The pitch is taken as an average as some manufacturers tend to group the gates in pairs so that there technically exist two gate to gate separations.

Each of the unit gate fingers is a heat source, so that the minimum pitch between the gate fingers is limited by electrical conductivity of the source and drain contacts and by thermal crosstalk, which in turn is primarily determined by the thermal conductivity of the substrate on which the transistor is made. The average pitch is the average distance between gates in the direction that is perpendicular to the gates. For commercially available AlGaN/GaN HEMTs on silicon carbide and silicon, the average pitch values range from around 35 um to 60 um. Standalone RF power transistor-bar chips and RF power amplifiers that use transistors integrated into MMICs are commercially available from companies like Qorvo of Greensboro, N.C. and Cree of Research Triangle Park, N.C. The typical substrates for present-day high-power RF transistors are GaAs for GaAs p-HEMTs, silicon for laterally-diffused MOS (LDMOS) transistors, and SiC for AlGaN/GaN high-electron mobility transistors. Silicon carbide is the substrate with highest thermal conductivity in commercial use today. Consequently, given the technology and cross-sectional design, the lateral dimension of the transistor design is the only design parameter that determines the transistor RF output power and hence building transmitters of increasing RF power amounts to managing wide transistor-chip bars or wide MMIC chips, namely, large chip widths. This fact is well known in the industry and examples of designs that make use of the knowledge can be found in publicly available books, such as: Steve Marsh, Practical MMIC Design, available from Artech House in Boston, USA.

There is a practical limit to how wide transistor-chip bars or how wide MMIC chips can be manufactured and this limit is related to the mechanical stability of the chips and process yield. This maximum width is of the order of several millimeters as can be seen in the commercial offering of the abovementioned providers. The challenge in obtaining RF transmitter modules with power greater than several tens of Watts lies with packaging several transistor-chip bars into multichip modules. A simplified top-view illustration of an exemplary packaged single-stage RF amplifier with four transistor-bar chips is illustrated in FIG. 1 (Prior Art). The packaged amplifier 100 comprises a flange 101 with an elevated rim 102 that encloses the package interior 105, an RF input lead 103 and an RF output lead 104. The package interior will ultimately be closed by soldering a lid (not shown to allow the interior to be seen) to the rim 102. The RF signal is directed from the input RF lead 103 towards the output RF lead 104. The RF input lead that protrudes into the package interior first delivers the RF signal to a microstrip RF power divider chip 107, whose function is to convert the external transmission impedance to the input impedance of the transistor on each transistor-bar chip 106 and to divide the input RF power into a multiplicity of identical transistor-bar chips 106. Packaged amplifier 100 is shown as having four identical transistor-bar chips 106 with power divider microstrip pattern 108 disposed on chip 107 dividing the input power into four ports attached to each bar using wire bonding 109. The output signal from each of the transistor-bar chips is combined using power combiner chip 110 and coupled to the output RF lead 104. Microstrip pattern 111 disposed on output power combiner chip 110 serves to combine the power from each of the transistor-bar chips 106 and transforms the impedance of the transistor manufactured on the transistor-bar chip 106 to the impedance of the external transmission lines (the impedance transforming pattern is not shown).

In such a highly parallel design, as is shown in the packaged amplifier 100, the three most important design challenges are (1) signal path matching, (ii) amplifier stability, and (iii) thermal limitations. Signal-path matching (i) amounts to ensuring that the RF path through each of the amplifiers from the input 103 to the output 104 is identical so that the signals can constructively add at the output power combiner 111, otherwise some of the RF power output from one of the transistor-bar chips will be dissipated due to destructive interference with signals from a neighboring transistor-bar chip. Amplifier stability (ii) is strongly dependent on the electromagnetic crosstalk between the transistor-bar chips and lateral electromagnetic resonances in the package. Both of these have to be minimized and eliminated in order to maintain the amplifier stability and prevent any power sinks due to resonances or oscillation. Amplifier stability becomes progressively more difficult to manage as the amplifier width 112, determined by the number of transistor-bar chips 106 in parallel, increases and becomes comparable to the wavelength at the operating frequency. The signal path management and amplifier stability place a limit to how large the package can be and how many parallel transistor-bar chips can be placed within it. Thermal limitations (iii) limit the maximum amount of power one can obtain from a package and hence how small can the package be for a given amount of power.

To go beyond these limits, one prior art approach is to combine amplifier packages (or modules) into amplifier systems in which the input signal is first divided among a multiplicity of separate amplifier packages and then the output of each of the amplifier packages is combined to provide one output. Inasmuch as the dimensions are now significantly larger than the dividers and combiners in the package, one has the possibility of using efficient power combiners made with waveguides, for example. Waveguide combiners generally tend to show lower combining loss than microstrip combiners. The advantage of this modular approach is that the physical separation between the amplifier packages results in dramatically reduced electromagnetic crosstalk and reduced thermal crosstalk, and hence higher amplifier stability.

FIG. 2 shows a block diagram 200 of a high-power RF amplifier using a multiplicity of packaged amplifier modules denoted 201. The figure shows eight modules 201, but the module number m is arbitrary. The RF signal with power $P_{IN}$ is brought to input port 202 and split into m equal power channels using RF power divider section 203. Power divider section 203 uses a binary tree of 1×2 Wilkinson power dividers 204 and hence there is an advantage of making m=$2^n$, where n is an integer. There are other ways of splitting the power, for example, using radial power combiners, hybrid junctions or power dividers that split one input into an odd number of outputs, as is well known in the art. The RF input signal is split into m channels, all ideally having the same amplitude and phase before they are amplified in each amplifier 201 as power $P_1$. The signal with power $P_1$ is amplifier with each amplifier 201 giving output power $P_2$. The output $P_2$ of each amplifier 201 is then combined using power combining section 205, which is also shown using 1×2 Wilkinson power combiners. Any RF losses in the input power divider 203 and output power combiner 205 reduce the amplifier efficiency. Output power combiner 205 tends to be designed for higher power handling and lower loss than input-stage power divider section 203, because more power may potentially be lost on the output combiner than on the input divider. The RF combined output is then fed to external port 206. The power dividers and combiners tend to be large and heavy, as waveguides generally exhibit lower loss than microstrip technology used for the input stage and inside the amplifier package.

An example of a commercial X-band multiple kW amplifier system 300 is shown in FIG. 3, including four RF power amplifier modules 301, 302, 303, and 304 separated with heavy metal heat conducting elements 308, and one waveguide output 306. The output from each of the amplifier modules is combined using a waveguide combiner 305 into waveguide output 306. Only the output power combiners are shown. The thermal management of this exemplary high-power RF amplifier system 300 includes liquid cooling using copper pipes 307 of which only the rounded edges are visible in this figure.

RF splitters, dividers, and combiners (if operated in reverse) are terms used for passive components that can be used to split RF power coming in from one port into multiple ports, most often two ports, but the output port number may be in some applications rather large. The terms splitters or dividers refer to RF signal division, while combiners refer to RF signal combining even though splitters, dividers and combiners may physically be identical due to reciprocity. The terms splitter, divider and combiner are often used interchangeably, although care should be taken regarding whether all of the ports are intended to be matched to the transmission lines and also whether the matching is adjusted to any specific line impedance. Furthermore, the splitters/combiners may be designed for more than one function: splitting the power and matching impedance at the same time. We shall refer to all of them for the remainder of this disclosure as combiners. There are resistive and hybrid combiners, and they differ in their insertion loss. Resistive combiners are generally broadband, but use resistors and are not used in the output stages of power amplifiers. Hybrid combiners use impedance transformation to perform RF signal combining or splitting, and are ideally lossless. The insertion loss of a splitter is a figure-of-merit of the quality of a splitter and it generally includes the loss of RF power due to the division of RF power to other ports, the part that is not actually lost as it has to be directed to another port, and the RF power that is lost due to radiation at the junction or transformation loss. The insertion loss (IL) of a power splitter/combiner is defined as $IL = -10 \cdot \log_{10}[P_m/P_0]$, where $P_0$ is the input RF power at the common port, and $P_m$ is the output RF power at one of the m output ports. RF combiners come in a large variety: on chips and inside packages the combiners are generally planar microwave circuits which use impedance transformation to accomplish the splitting and combining of RF signals without too much loss. The power combining outside of the package may be realized using microstrip traces, and/or using coaxial combiners and high power waveguide combiners. Waveguide combiners (like the example shown in FIG. 2) are large, but also exhibit low loss at high frequency.

It is clear that reaching high power RF output in amplifier systems requires massive microwave hardware and sophisticated thermal management. The higher the frequency, the lower the contributed power per amplifier, especially when InP or GaAs based materials are used, because of their low breakdown voltage. It is also clear that the size of the completed amplifier system at kW levels is directly determined by the size of the amplifier chip, as was discussed above, and that given the maximum size and weight constraint, the most efficient way to increase the output power of these modules is to improve the output power $P_2$ of each of the chips situated in the amplifier 201 in FIG. 2. (This is equivalent to increasing the maximum output power of each of the transistor chips 106 in FIG. 1.) By increasing the power output $P_2$ of an individual transistor chip 106 one will improve the output power $P_{OUT}$ of the overall RF amplifier module.

RF combiners may be realized as a microstrip pattern on an amplifier chip, integrated into an MMIC chip or provided on a dielectric chip to be placed next to the MMIC within an RF amplifier package (example shown with 108 in FIG. 1). RF combiners may also be realized as an electromagnetic waveguide combiner (see, for example, element 305 in FIG. 3) or as coaxial RF combiners.

It is hence clear that there is a need in the industry for high power RF amplifiers that are smaller and lighter for given power, and hence have extended reach, as improving the signal-to-noise ratio delivers the possibility of error-free communication over a larger distance.

BRIEF DESCRIPTION OF THE INVENTION

Figure 1:
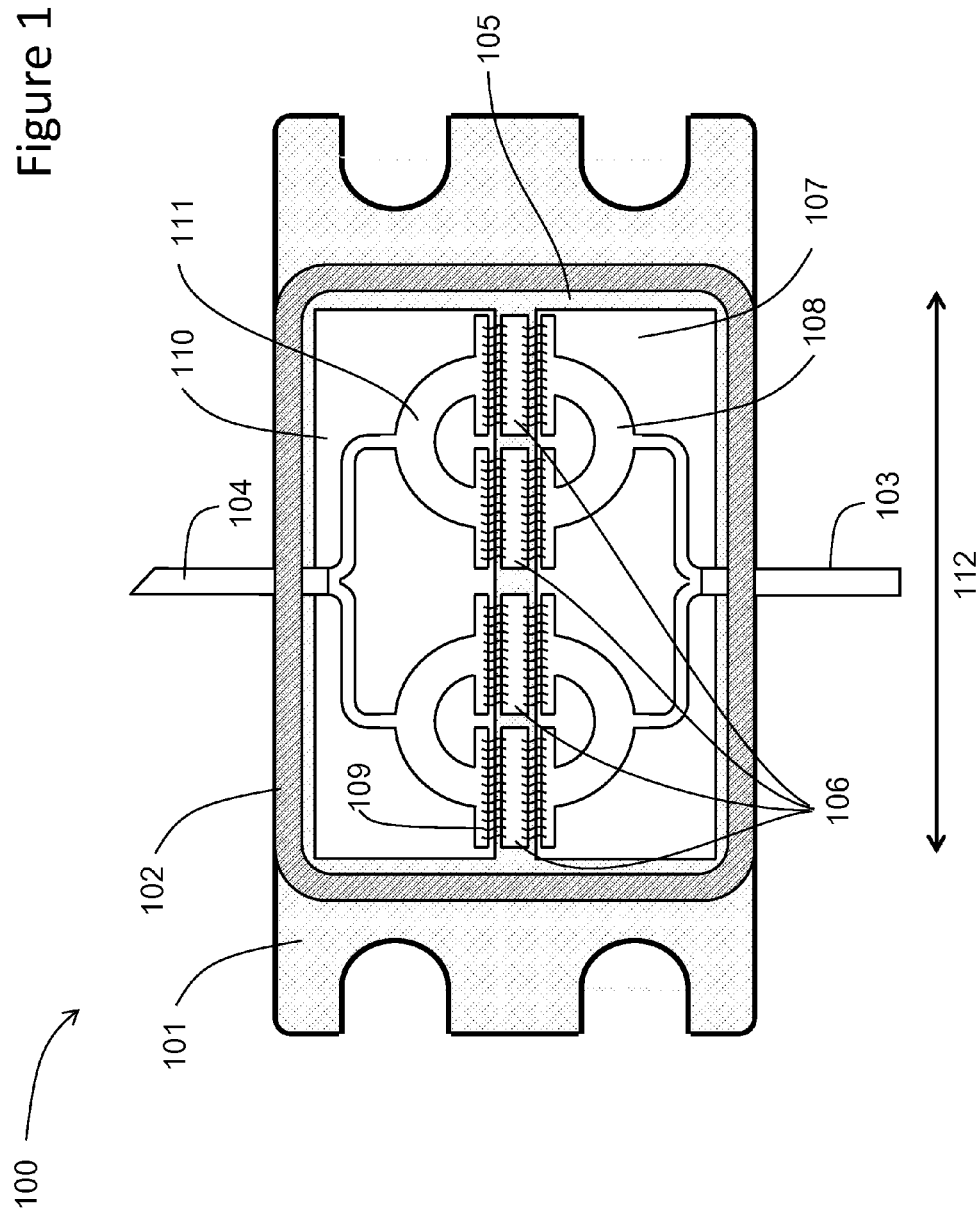
FIG. 1—(Prior Art) An example of a high-power multi-chip X-band RF amplifier package with four chips and chip power RF dividers/combiners.

One aspect of the present invention is directed to the design and manufacturing of an efficient high power RF power amplifier. This application discloses an improvement in the performance of RF amplifier modules and equipment for communications between land, space and airborne entities by using monolithically integrated microwave circuits based on Gallium-Nitride-on-Diamond (GaND) technology. Microwave amplifiers based on GaND technology comprise active regions (AlGaN/GaN field-effect transistors) and passive components disposed on top of synthetic diamond substrates. Diamond provides thermal conductance surpassed by no other material known to man: depending on the manufacturing conditions, the thermal conductivity ranges between 800 and 2200 W/km. Using diamond in place of sapphire, silicon or SiC as the substrate material in high-power AlGaN/GaN field-effect transistors has been shown to reduce the device thermal resistance two-to-three times relative to GaN/SiC. Diamond provides this large reduction in overall device thermal resistance by spreading the amplifier-generated heat below the device. The heat spreading is most pronounced in small electronic devices in which the device lateral dimensions are of the order of the substrate thickness or greater. For example, high-electron mobility AlGaN/GaN transistors operating in the X-band and above are designed with unit gate widths of 100 μm and shorter because of microwave performance. In such devices, the improvement in the thermal performance by using diamond substrates rather than conventional substrates is very significant. Reported improvements in thermal conductivity and output power from GaND chips relative to GaN/SiC are 2× to 3×.

One objective of this application is to disclose high-power amplifiers with size and weight reduced relative to present technology. This is particularly important for mobile and portable communications equipment.

Another objective of this application is to disclose high-power amplifiers that have longer communication reach for the same weight and size in comparison with present day technology, namely, that for a high power amplifier of given size and weight, the disclosed chips result in an amplifier data transmission rate that is higher than it would be for amplifiers using existing technology.

DETAILED DESCRIPTION

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

For a given technology, the overall output power of an MMIC or a FET depends on the periphery of the output transistor. The periphery is the product of the unit gate width W and the number of fingers F. However, it is well known that for a given frequency the unit gate length has to be kept constant, hence the only way the periphery can increase is by increasing the number of fingers F. Increasing the number of fingers increases the width of the output transistor, which in turn means increasing the width of the MMIC chip (if the output transistor is a part of the MMIC chip) or increasing the width transistor-bar chip. Increasing the width of the output transistor reduces the chip thermal resistance. As the transistors are elongated along the direction perpendicular to the RF signal propagation ("the width of the chip"). The thermal resistance of the chip is approximately inversely proportional to the width of the output transistor. Hence, as increasing the periphery by increasing the number of fingers F, increases the transistor-bar chip or MMIC width, it thus reduces the thermal resistance according to an inverse relationship. As the output power varies directly with the periphery, the product of the output power and the thermal resistance is approximately constant. This is in line with the fact that the peak temperature of the transistor is equal to the product of the thermal resistance and the output power and the peak temperature has to remain bound for reliability purposes.

A system thermal budget is an assessment of temperature drops on each component between the heat source (for example, the active channels of output-stage power transistor), and the environment around the system, where ultimately we wish to dissipate the heat generated by the source. The active layers of a semiconductor device, such as a bipolar transistor or a field-effect transistor, are typically only several micrometers thick, and are built on top of thick mechanical carriers, which are generally referred to as substrates in the industry. The crystalline semiconductor layers grown by epitaxial growth methods such as metal-organic chemical vapor deposition (MOCVD) or molecular beam epitaxy (MBE) are generally referred to as epilayers. For the purposes of this application, a substrate is a carrier on which one or more semiconductor devices are made. A substrate may have functional utility in addition to said mechanical use. The substrate may be of the same family of materials as the active layers of the electronic device, such as it is when active layers (or epilayers) are epitaxially grown on single-crystal substrates. This is the case with GaAs microwave devices on GaAs substrates, AlGaN/GaN devices on sapphire, silicon and SiC substrates.

Electronic devices may be realized by attaching the active layers to substrates made out of materials with crystalline structures and chemical compositions that are very different from those of the active layer. In such cases, the active layers are not grown epitaxially on the final substrate, but rather transferred from their original growth substrate to the final or new substrate of interest. In the industry, the process of attachment is referred to as bonding or direct-bonding. Examples include direct-bonded InP lasers on silicon and AlGaN/GaN high-electron mobility transistors attached to synthetic diamond substrates.

Alternatively, synthetic diamond may be grown on the back of a stack of active layers, thereby forming a substrate on the back of the active layer stack. In this case, the stack of active layers are grown on a first substrate, then the first substrate is removed, and finally synthetic diamond in grown on the stack, replacing the removed first substrate. What is generally known in the industry as a "chip" is a structure that comprises an electronic device active layer structure (epilayers) disposed on a substrate which is the primary mechanical support for the device. The electronic devices are generally built on top of the active epilayers. The substrate generally has functions including but not limited to mechanical support. Three substrate attributes used in the industry are (i) electrical conductivity which is needed to connect the active layers to the bottom of the chip, (ii) electrical isolation with low dielectric losses needed in high-frequency devices and surface waveguides where electric fields penetrate into the substrate, and finally (iii) high thermal conductivity, with or without associated electrical conductivity.

In this disclosure, a "chip" is defined as comprising an active electronic or optical device disposed in or on the active epilayers that are disposed on a substrate. It is therefore not possible to obtain a chip having electronic-device active layers without also having an accompanying, attached substrate. A chip may contain one transistor or it may contain an entire microwave monolithically integrated circuit (MMIC).

Diamond heat-sinks, diamond heat-spreaders, and other diamond plates intended to spread heat below semiconductor chips for thermal management are well known in the industry; they are sold commercially by companies such as Element Six in Santa Clara, Calif., and Applied Diamond, Inc. from Wilmington, Del. The difference between a diamond substrate and a diamond heat-sink (or heat-spreader or plate) as currently understood in the industry is that a diamond substrate on which active electronic device layers are attached forms a chip, while a diamond heat-sink is simply a thermal component that may be attached to a chip to help spread the heat generated by that chip. In other words, in the present invention, a diamond substrate becomes an integral part of its corresponding chip, essential to the chip's structure and function, while a diamond substrate is simply an external component, that may be physically attached to a chip to improve aspects of the chip's performance. In one embodiment of the present invention, a chip comprising an AlGaN/GaN active device disposed on a synthetic diamond substrate is mechanically attached to a diamond heat-sink thereby creating a structure that has two diamond layers separated by an adhesive layer (generally, a solder).

Thermal Design of AlGaN/GaN Transistors

Figure 4:
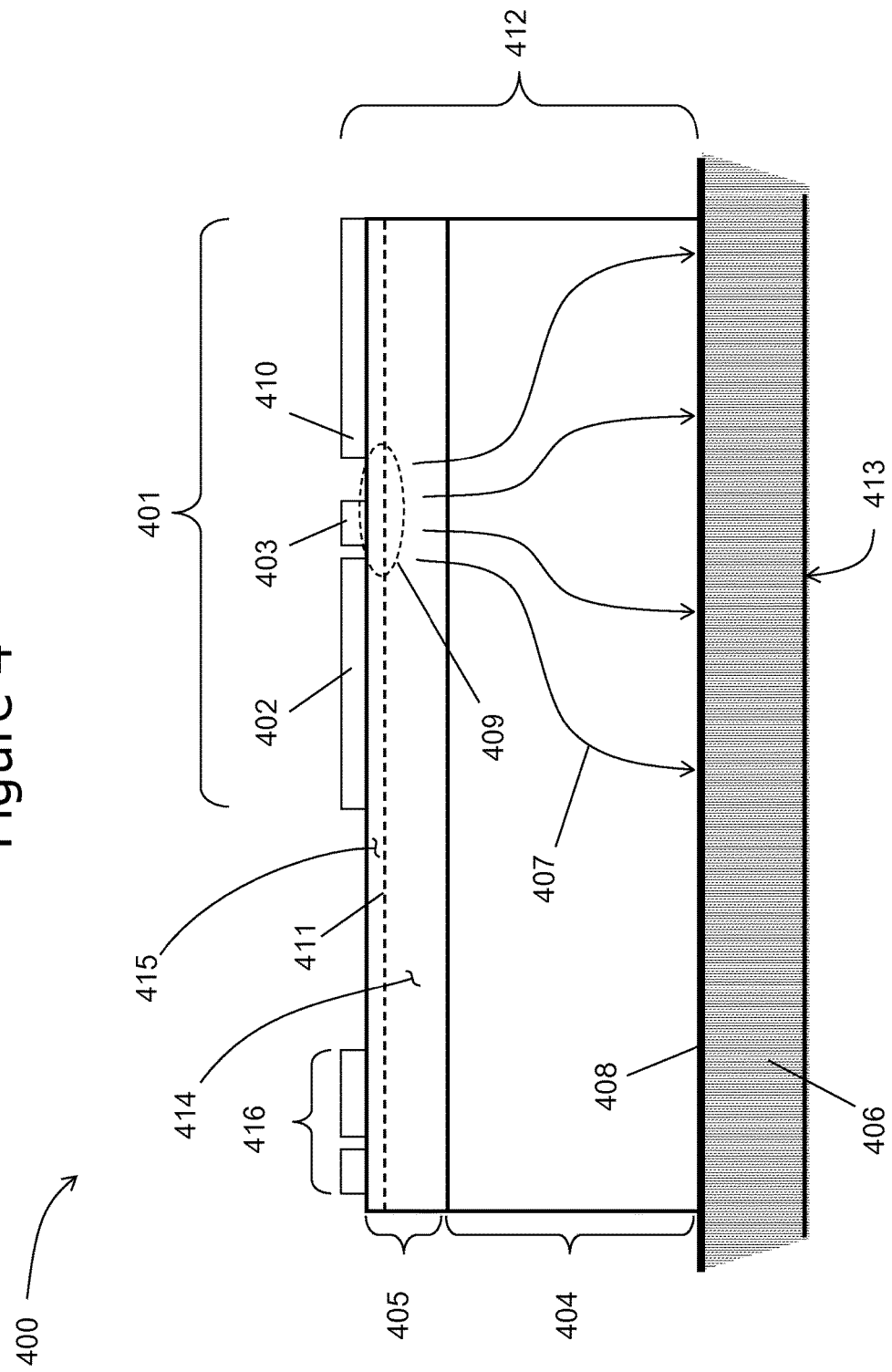
FIG. 4—A cross-section view of an AlGaN/GaN transistor employing Gallium Nitride on diamond (GaND) technology according to one embodiment.

A cross-sectional view of an attached monolithically integrated microwave or millimeter-wave circuit (MMIC) 400 employing GaND technology is illustrated in FIG. 4. An MMIC chip 412 attached to a package base or flange 406 (like that illustrated in FIG. 1 as element 101) comprises epilayer 405 disposed on substrate 404, attached to package base 406 using solder layer 408, A package base is the portion of a package to which a chip is attached; the majority of the heat generated by the chip is typically dissipates through the package base.

The MMIC chip 412 comprises an epilayer 405 which in turn comprises passive and active electrical devices 416 and 401 respectively, positioned in or on top of the epilayer 405. Aspects of the thermal improvements possible with GaND technology may be appreciated with reference to electrical contacts 402, 403 and 410, associated with output transistor 401, in the case where active circuit 401 is an output transistor. A high-electron mobility transistor (HEW) 401 or heterostructure field-effect transistor (HFET), as such devices are also known, comprises source 402, gate 403, and drain 410 terminals disposed on an epilayer 405 containing a two-dimensional electron gas source (2DEG) 411 embedded within the epilayer 405 disposed on substrate 404. Transistor 401 operates by using the voltage applied between the gate 403 and the source 402 to control the current flowing along the 2DEG 411 between the source 402 and the drain 410. The region of the 2DEG where the gate voltage controls the current is below the gate 403 terminal. The crystalline layers above and below the 2DEG 411 are generally referred to as the barrier layer 415 and the buffer layer 414 respectively. Epilayer 405 includes each of these two crystalline layers and the 2DEG 411. It is well known in the art that the buffer layer 414 may comprise more than one layer of different materials.

Active regions of conventional gallium nitride high-electron mobility transistors comprise GaN and AlGaN alloys, but improvements in the performance of the transistors can be accomplished by including InGaN and InGaAlN alloys to improve electron confinement, transconductance, and/or performance over temperature. All of the mentioned materials may be implemented in AlGaN/GaN high-electron mobility transistors.

During the operation of this transistor, the majority of the heat dissipates in region 409 of epilayer 405. The challenge of realizing a highly thermally efficient transistor lies with the ability of the structure to conduct dissipated heat away from region 409 to the external world via substrate 404 and package base 406. The majority of the heat flows from the location of generation 409 through buffer layer 414 and substrate 404 to package base 406 and then through package base 406 and through surface 413 into a heat conducting element or heat dissipating element (not shown in FIG. 4) attached to surface 413. Some of the the heat spreading and direction of flow is indicated with arrows 407. The objective of an efficient transistor-chip thermal design is to reduce the thermal resistance between the source of heat 409 and the back surface 413 of package base 406. For the purposes of this invention, the thermal resistance of the output transistor of an amplifier (whether it is a MMIC or an array of power transistor bars) is defined as the difference between the peak temperature of the transistor in the region 409 and the average temperature of back surface 413 of package base 406, divided by the power dissipated at the output transistor or transistors during normal operation. Other definitions of thermal resistance, which do not include the package base or specify peak temperature of the package base to heat conducting element rather than the average temperature are sometimes used in the industry and they can be used as means for comparison between designs. The thermal resistance of the transistor shown in FIG. 4 is determined in part by the sum of the temperature drop contributions in different layers (or structures) that the heat has to traverse in its path from the active layer 409 to the heat conducting element below the package (attached to surface 413).

The physical factors that determine the thermal resistance of the structure shown in FIG. 4 are proportional to the thermal conductivities of the materials and the distance the heat has to traverse, and inversely proportional to the effective cross-sectional area the heat has to pass through. From heat generation area 409, the heat first has to traverse buffer layer 414 which comprises bulk GaN with thermal conductivity κ~130 W/mK. Barrier layer 415 (above the 2DEG) is built from ternary and quaternary alloys AlGaN, InGaN, and InAlGaN which exhibit lower thermal conductivities than GaN due to alloy scattering, but contribute less to the thermal conductivity than the buffer layer. As the use of GaN material is fixed by the choice of the type of transistor and the total size of the active layer by desired transistor performance and desired output power, the desired reduction of buffer-layer thermal resistance is primarily accomplished by optimizing the thickness of the buffer layer. In conventional GaN transistors manufactured in a single epitaxial growth on substrates such as, silicon carbide, silicon, or sapphire, an interfacial layer has to be grown on top of the substrate prior to growing the buffer layer because these substrates exhibit a non-negligible lattice mismatch with GaN. The interfacial layer has to absorb the dislocations created by growth on a lattice mismatched substrate. Even with the interfacial layer, crystal quality is insufficient for the growth of a high quality 2DEG. The quality of the surface of the buffer layer on top of which 2DEG is to be grown is improved by increasing the thickness of the buffer layer since, depending on growth recipe, GaN tends to mend itself during growth finally producing a surface with lower number of dislocations for thicker buffer-layer films. For this reason, buffer-layer thicknesses in conventional GaN transistors range from 500 nm to 2000 nm, substantially adding to the thermal resistance of the structure. The thickness of the substrate is optimal for heat spreading when its thickness is comparable to the smaller dimension of the heat source, the unit gate width, but is also determined by mechanical stability. GaN-on-diamond HEMTs show performance advantages over competing technologies in operation at all frequencies, but the advantages are more pronounced at frequencies in the X-band and greater as the unit gate width is narrower than 100 um. For frequencies in the Ka-band, the unit gate width is 50 um. For these reasons, in one embodiment, the thickness of the synthetic diamond layer below the transistor or synthetic-diamond substrate is set by device design and fabrication to lie in the range between 50 um and 300 um. High substrate thermal conductivity of GaN-on-diamond transistor furthermore allows the reduction of the gate-to-gate pitch, which in turn further increases the RF output power per unit chip transistor-bar chip width or MMIC chip width. In one embodiment, the gate-to-gate pitch of the transistor is less than 25 urn.

In gallium nitride on diamond transistors, the buffer layer is not grown on the substrate, but bonded to the diamond substrate. Prior to this bonding process step, the original growth substrate (for the GaN epilayers) and the corresponding interfacial layer are removed, exposing the back surface of the buffer layer (surface facing the substrate in FIG. 4). One of the methods of bonding the two materials is by growing the synthetic diamond substrate on the back of the buffer layer coated with a nanometer thin intermediary dielectric layer. While the bottom surface of the buffer layer is exposed it is also thinned down prior to diamond bonding in order to optimize the thermal properties. This process is not straightforward, as very thin layers are subject to cracking and instability due to embedded strain. Nevertheless, thermally optimal buffer layer thicknesses can be achieved thereby allowing creating devices with high thermal conductivity. The thickness of the buffer layer is adjusted depending on the thermal properties of the interface between the synthetic diamond substrate and the buffer layer. Dramatic improvements over conventional transistors can be achieved when the buffer thickness is less than 150 nm. In one embodiment, the distance between the 2DEG and the substrate is set by device design and fabrication to be less than 150 nm.

In one embodiment, epilayer stacks with fully completed or partially completed electronic or optical devices are attached to substrates with high thermal conductivity. In another embodiment, the substrate is made out of synthetic diamond and in yet another embodiment, the electronic device is an AlGaN/GaN high-electron mobility transistor (HEMT), also known in the industry as a heterostructure field-effect transistor (HFET).

In one embodiment, synthetic diamond is grown on the back of blank epilayers that were prepared for manufacturing electronic or optical devices. In yet another embodiment, the electronic device is an AlGaN/GaN high-electron mobility transistor (HEMT), also known in the industry as a heterostructure field-effect transistor (HFET).

In another embodiment, a layer of synthetic diamond is applied as a top coating for a completed or partially completed transistor structure on top of an epilayer stack. The purpose of the diamond layer is to extract the heat from the device upwards and then to spread the heat laterally over the device to be absorbed by substrate regions that are not directly under the transistor. In another embodiment, the substrate is made out of synthetic diamond.

Figure 7:
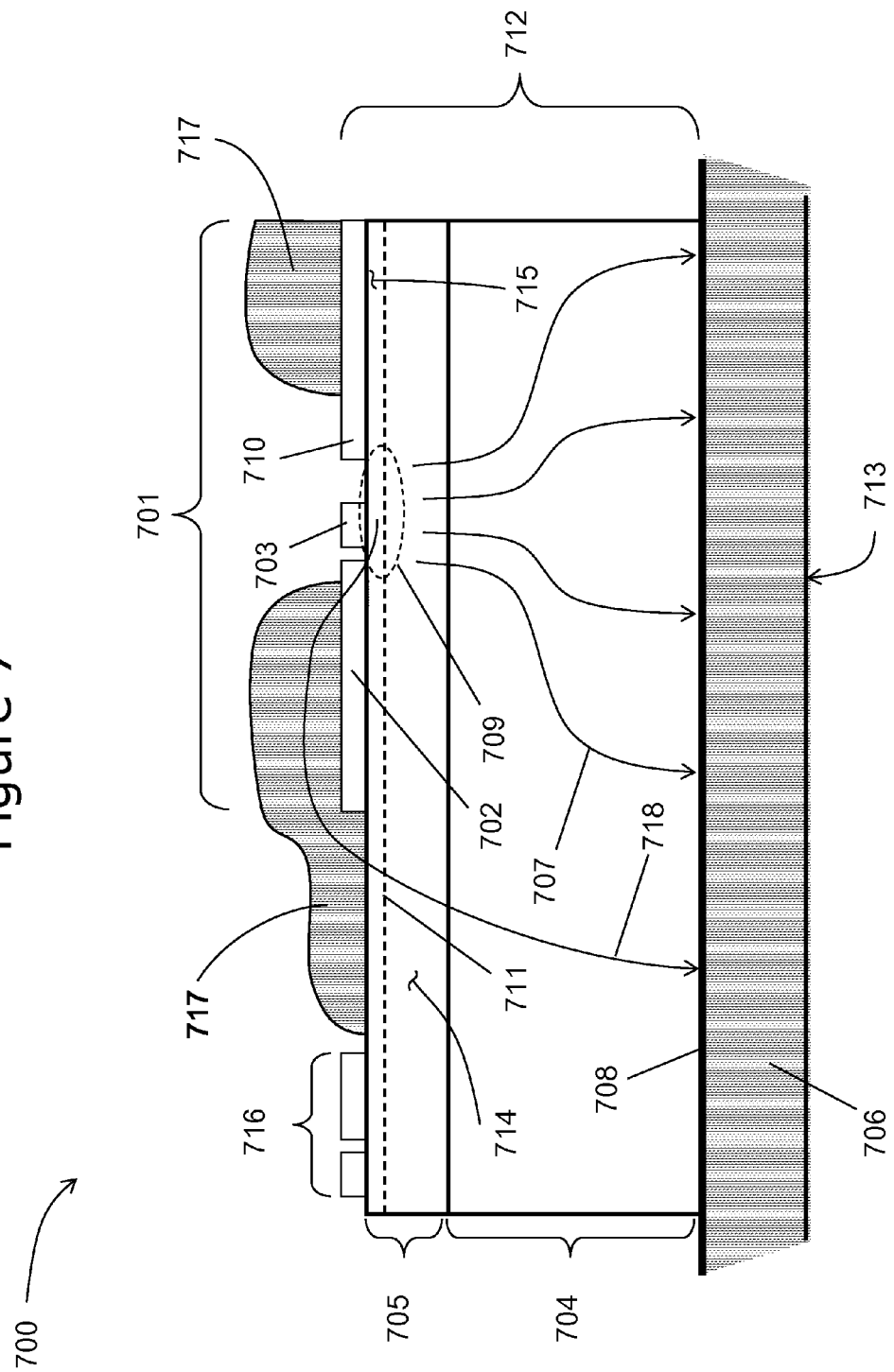
FIG. 7—A cross-section view of an AlGaN/GaN transistor employing Gallium Nitride technology according to one embodiment of the present invention.

One embodiment of an attached monolithically integrated microwave or millimeter-wave circuit (MMIC) 700 employing synthetic diamond technology is illustrated by the cross-sectional view shown in FIG. 7. An MMIC chip 712 attached to a package base 706 that comprises epilayer 705 (which may include a stack of component epilayers) is disposed on substrate 704, attached to package base 706 using solder layer 708. A package base is the portion of the package to which a chip is attached and through which majority of the heat is being dissipated.

Similarly to FIG. 4, the MMIC chip 712 comprises an epilayer 705 which in turn comprises passive and active electrical devices 716 and 701 respectively, positioned in or on top of the epilayer 705. Aspects of the thermal improvements possible with synthetic diamond technology may be appreciated with reference to electrical contacts 702, 703 and 710, associated with output transistor 701, in the case where active circuit 701 is an output transistor. A high-electron mobility transistor (HEMT) 701 comprises source 702, gate 703, and drain 710 terminals disposed on an epilayer 705 containing a two-dimensional electron gas source (2DEG) 711 embedded within the epilayer 705 disposed on substrate 704. Transistor 701 operates by using the voltage applied between the gate 703 and the source 702 to control the current flowing along the 2DEG 711 between the source 702 and the drain 710. The region of the 2DEG 711 where the gate voltage controls the current is below the gate 703 terminal. The crystalline layers above and below the 2DEG 711 are generally referred to as the barrier layer 715 and the buffer layer 714 respectively. Epilayer 705 includes each of these two crystalline layers and the 2DEG 711.

During the operation of this transistor, the majority of the heat dissipates in the region 709. The challenge of realizing a highly thermally efficient transistor lies with the ability of the structure to conduct dissipated heat away from the region 709 to the external world via the substrate 704 and the package base 706. The majority of the heat flows from the location of generation 709 through the buffer layer 714 and the substrate 704 to the package base 706 and across the package base 706 across the surface 713 into a heat conducting element or heat dissipating element (not shown in FIG. 7). The heat spreading and direction of flow is indicated with arrows 707. The objective of an efficient transistor-chip thermal design is to reduce the thermal resistance between the source of heat 709 and the back of the package base 713. In this device, unlike the device shown in FIG. 4, there are two significantly different ways in which heat can get out of the heat generation area 709. The first way, essentially the same as that discussed above with regard to FIG. 4, is by traversing buffer layer 714, spreading though substrate 704 to reach package base 706 via the arrows labeled 707. The second way the heat generated in the area 709 may leave is by spreading through the buffer 714 and through the barrier layer 715 and the terminals 702 and 710 into a coating 717 made out of synthetic diamond, which is disposed over at least some parts of electronic device 701, passing through 717 to areas away from the device and then through the epilayer 705, and substrate 704 to package base 706 via a path shown with arrow 718. Although the barrier layer 715 (above the 2DEG) is built from ternary and quaternary alloys AlGaN, InGaN, and InAlGaN which exhibit lower thermal conductivities than GaN due to alloy scattering, they are relatively thin and the heat can easily pass into the terminals 702 and 710 into synthetic diamond layer 717. In one embodiment, a AlGaN/GaN HEMT comprises a layer of synthetic diamond disposed on top of at least a portion of said AlGaN/GaN HEMT. In yet one embodiment, a GaN-on-diamond transistor comprises a layer of synthetic diamond disposed on top of at least a portion of said GaN-on-diamond transistor.

A packaged module or device of the present invention, containing an RF amplifier chip is always mounted onto a heat conducting element which is an object with high thermal conductivity in thermal contact with the ambient and is efficient in transferring the dissipated power to the ambient. The heat conducting element may include heat pipes or other fluid cooling mechanism. In one embodiment, the package base comprises a layer of synthetic diamond.

Design Consideration in High Power RF Amplifiers

Refer back to FIG. 2 in which a multiplicity of RF power amplifier packages or individual modules is used to produce high power output by combining the outputs all amplifiers. The couplers, shown as Wilkinson power dividers, are not ideal so some power is lost in the power division: the output at each of the two output ports is $\gamma/2$ times the input power, where $1-\gamma$ is the fraction of input power lost at each junction ($10 \log(1-\gamma)$ is the loss expressed in dB), which means that for $m=2n$ parallel amplifiers, the input power $P_1$ to each of the amplifiers will be equal to the input power to the amplifier module $P_{IN}$ reduced by the losses in all the couplers, hence $P_1 = P_{IN}(\gamma/2)^n$. Similarly, the output power $P_{OUT}$ of the amplifier module will be a sum of the individual outputs from each amplifier $P_2$ reduced by the loss in the couplers, hence $P_{OUT}=P_2(2\gamma)^n$. If each of the amplifiers (1, 2, 3 . . . m) has overall efficiency η, and power gain G, the entire amplifier module will have efficiency:

$$\eta_{OUT} = \frac{\eta\gamma^n}{1 + \frac{\eta}{G}\left(\frac{1-\gamma^n}{\gamma^n}\right)} \quad (1)$$

where it is clear that the amplifier is affected by the losses in the output couplers.

Figure 2:
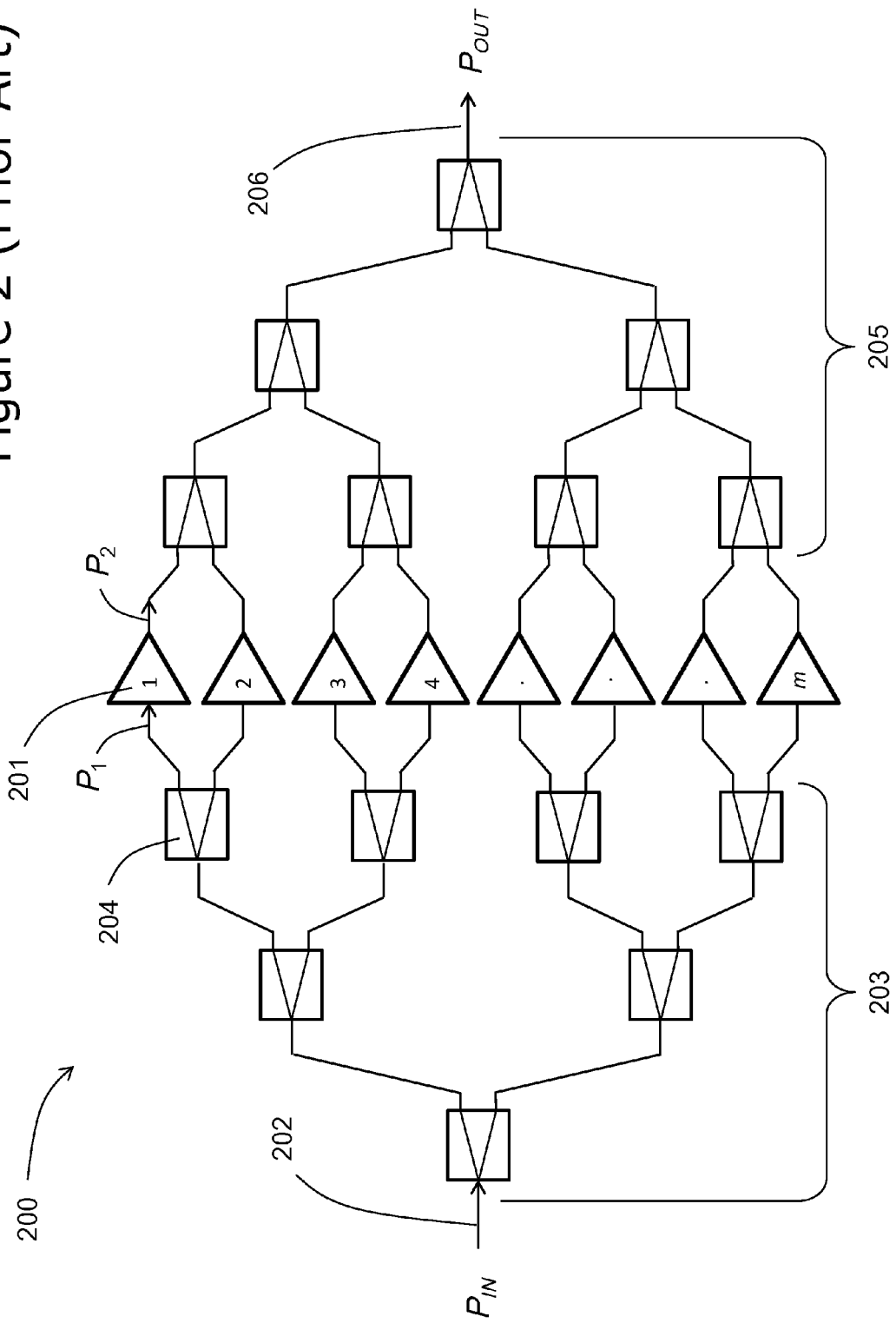
FIG. 2—(Prior Art) Block diagram of power combining using a multiplicity of power amplifier modules in an RF amplifier system.
Figure 3:
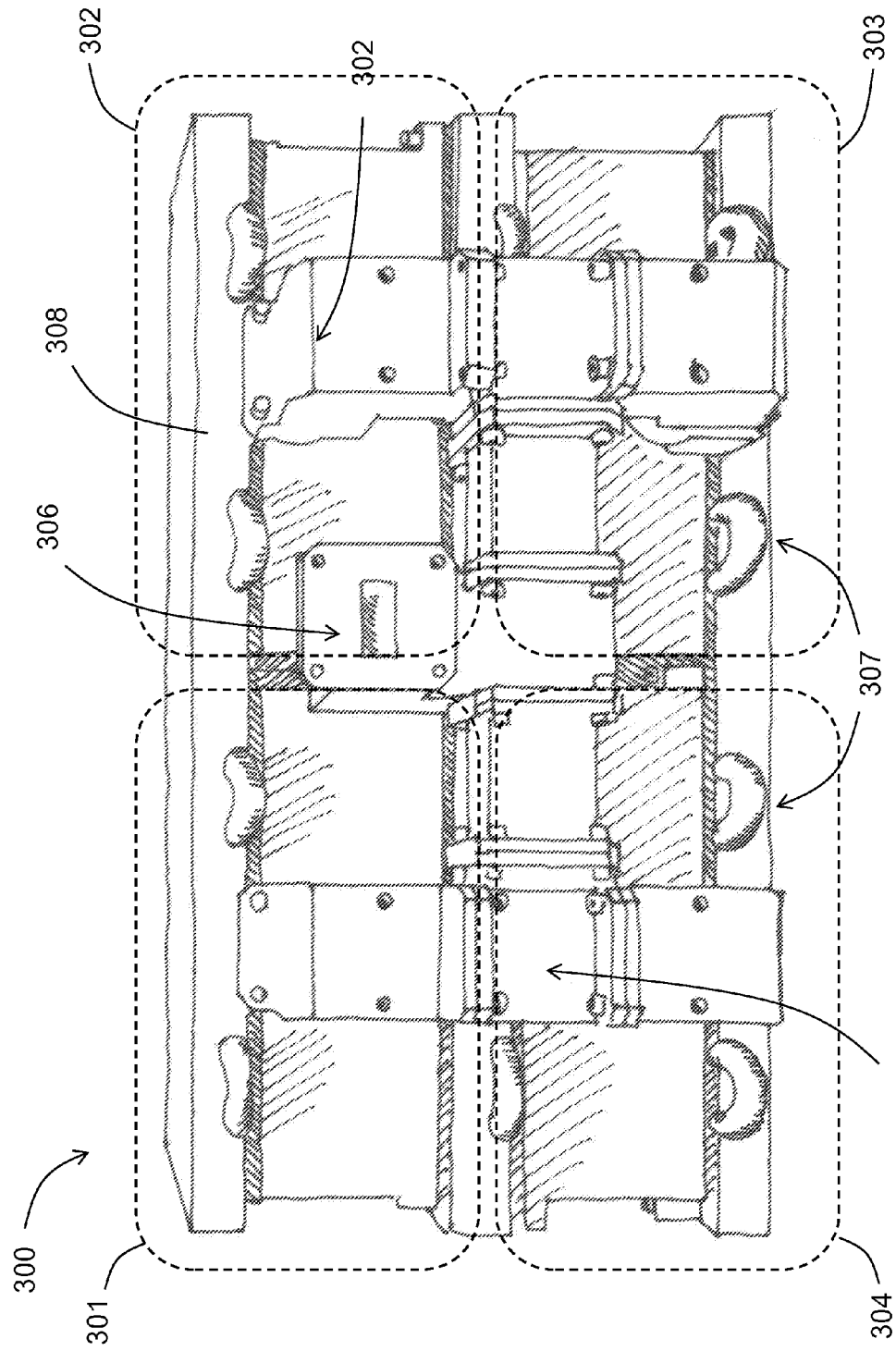
FIG. 3—(Prior Art) An exemplary view of a commercial kW-rated X-band power amplifier system with liquid cooling and waveguide output.
Figure 5B:
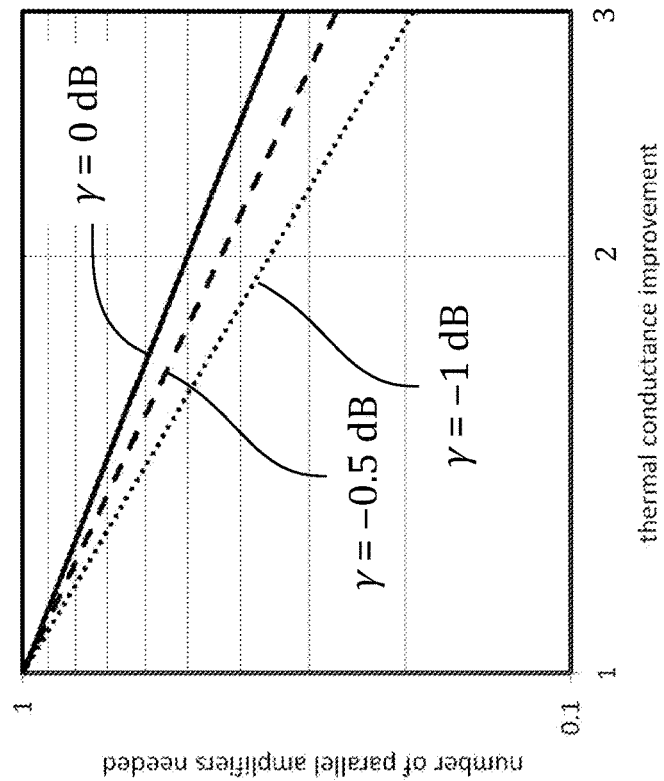
FIG. 5B—Computed improvement in number of parallel amplifier chips as a function of improved thermal resistance as compared to conventional amplifiers (GaAs and GaN/SiC).
Figure 5A:
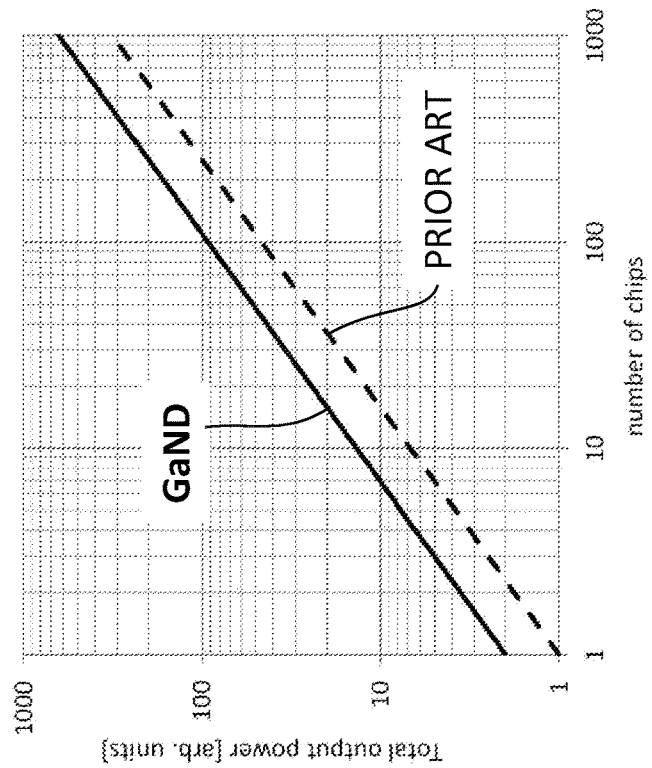
FIG. 5A—Computed improvement in power handling of RF amplifier system using the disclosed GaND technology as compared to conventional (PRIOR ART) amplifiers (GaAs and GaN/SiC).

The improvement in total output power for the same number of amplifier chips which is made possible by employing GaN on diamond transistors is illustrated with a simple computation, results of which are shown in FIG. 5A. The total output power of an amplifier module like the one shown in FIG. 2 is given by $P_{OUT}=(2\gamma)^n P_2$. In order to increase the output power capability of an amplifier module $P_{OUT}$, we naturally increase the number of chips m=$2^n$. This functional relationship between $P_{OUT}$ and m is shown for a coupler loss equal to 1 dB in FIG. 5A with the label PRIOR ART. Note that the relationship is necessarily sublinear, in the sense that a tenfold increase in the number of chips m results in a less than tenfold increase in output power $P_{OUT}$. A more efficient approach than simply increasing m is to improve the thermal resistance of the chip and allow more output power to be emitted from each of the chips. The graph in FIG. 5A illustrates this improvement when the power per amplifier $P_2$ is doubled by reducing the thermal resistance, indicated by the label GaND. Owing to the nature of the non-linear $P_{OUT}$ vs m relationship, doubling $P_2$ corresponds to a reduction in m of more than a factor of 2 for the same output power. The graph in FIG. 5B illustrates the reduction in the number of chips m with the thermal resistance improvement available with GaND over GaN/SiC for γ=0 dB, −0.5 dB, and −1 dB.

In an alternative embodiment of GaND amplifier technology, the amplifier can be made to operate cooler; since the efficiency and the gain of microwave amplifiers are temperature dependent, they both improve as temperature is reduced. For a given output power, increasing temperature has a twofold effect on the total dissipated power: through the loss of efficiency and loss of gain. The dissipated power can be easily expressed relative to the total output power as:

$$\frac{P_{DISS}}{P_{OUT}} = \frac{1-\eta}{\eta} + \left(\frac{1}{G\gamma^n} + \frac{1}{\eta}\right)\left(\frac{1}{\gamma^n} - 1\right) \quad (2)$$

The first term depends on the efficiency and is present regardless of the coupler loss. The second term depends on the coupler loss. The total dissipated power determines the cooling requirements of the amplifier module and hence the size of the amplifier.

Figure 6:
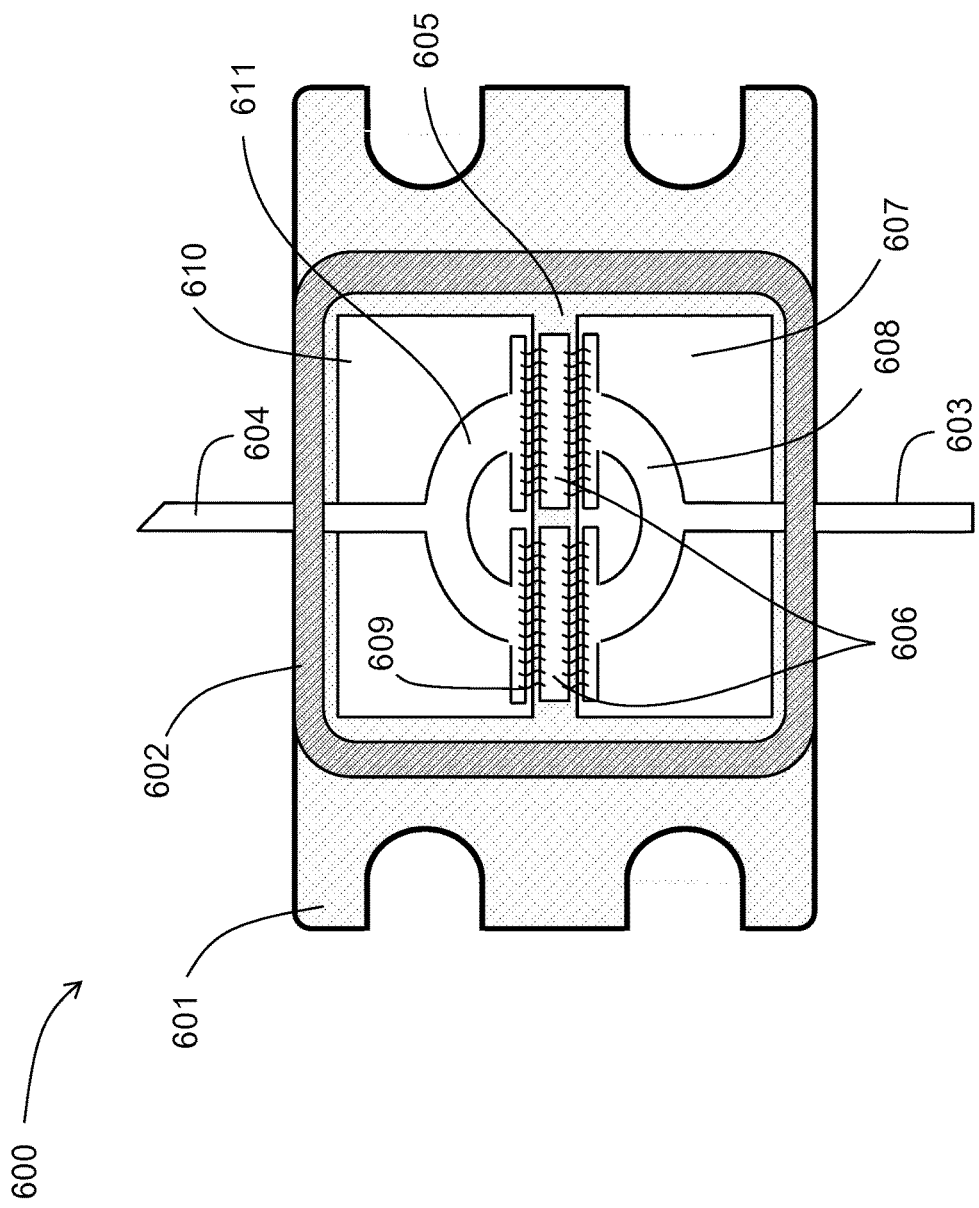
FIG. 6—Top view of a high-power RF amplifier module according to one embodiment of the present invention.

FIG. 6 is a simplified top-view illustration of a packaged single-stage RF amplifier module according to one embodiment of the present invention. A packaged RF amplifier 600 comprises a flange 601 with an elevated rim 602 that encloses the package interior, an RF input lead 603 and an RF output lead 604. Visible at the bottom of the package interior is package base 605. The RF signal is directed from the input RF lead 103 towards the output RF lead 104. The RF input lead that protrudes into the package interior first delivers the RF signal to a microstrip RF combiner chip 607, whose function is to convert the external transmission impedance to the input impedance of the transistor-bar chips and to divide the input power into a multiplicity of identical transistor-bar chips 606. The packaged RF amplifier 600 is shown for simplicity as having only two identical transistor-bar chips 606 bonded with bondwires 609 to the combiner chips 607 and 610, although in other embodiments of course there may be more. The output signal from each of the transistor-bar chips 606 is combined using power combiner chip 610 and coupled to the output RF lead 604. Microstrip combiner pattern 611 disposed on output power combiner chip 610 serves to combine the power from each of the transistor bars 606 and transform the transistor impedance to the impedance of the external transmission lines (the impedance transforming pattern is not shown). The bottom of the package interior 605 is the package base to which the chips 606 are attached using solder or high thermal conductivity epoxy. In one embodiment, at least one of the combiner chips 607 or 608 is attached to package base 605. Using GaND technology to form chips 606, due to the consequent lower thermal resistance and, hence, higher output power capability of each of the chips 606, the combiner is adjusted to handle higher power, reduced in size if necessary and optionally built from higher thermal conductivity materials to further assist heat dissipation. In one embodiment, RF power combiners are used in the same RF amplifier system, optimized for use with GaN-on-diamond amplifier chips. In one embodiment, the output power RF combiner is a waveguide combiner.

Lowered thermal resistance of the chips based on GaN-on-diamond technology, will reveal that the package base is one of the heat flow limitations and for this reason, the package base will have to be manufactured with higher thermal conductivity materials. In one embodiment, the package base is made in part of synthetic diamond.

In yet another embodiment, the amplifier system is situated within a housing which comprises a multiplicity of RF amplifier modules, each of which comprises a package, at least one input port, at least one output port, at least one RF amplifier chip attached to said package, said RF amplifier chip comprising at least one electronic device disposed on an epilayer overlying a substrate, an RF power combiner coupled to said output port, and a heat conducting element, wherein said substrate comprises a first layer of synthetic diamond characterized by an average value of thermal conductivity. In yet another embodiment, the average thermal conductivity of synthetic diamond is 1000 W/mK.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The invention claimed is:

1. An RF amplifier module comprising
   a package having a package base, at least one RF amplifier chip attached to said package base, said RF amplifier chip comprising a substrate and at least one transistor comprising an epilayer overlying said substrate, wherein said substrate comprises a first layer of synthetic diamond characterized by an average value of thermal conductivity, an RF power combiner chip attached to said package base, and a second layer of synthetic diamond at least partially disposed adjacent to said at least one transistor; wherein said package base comprises synthetic diamond.

2. The RF amplifier module of claim 1, wherein said substrate is characterized by a thickness between 50 μm and 300 μm.

3. The RF amplifier module of claim 1, wherein said average value of thermal conductivity is greater than 1000 W/mK.

4. The RF amplifier module of claim 1, wherein said transistor is an AlGaN/GaN high-electron mobility transistor.

5. The RF amplifier module of claim 1, wherein said epilayer comprises a two-dimensional electron gas layer positioned no further than 150-nm from said substrate.

6. The RF amplifier module of claim 1, further comprising a multiplicity of parallel transistor gates disposed on said transistor, wherein an average separation between said gates in the direction perpendicular to said gates is less than 25 μm.

7. An RF amplifier module comprising: a package having a package base,
    at least one RF amplifier chip attached to said package base, said RF amplifier chip comprising a substrate and at least one transistor disposed in an epilayer overlying said substrate, and
    an RF power combiner chip attached to said package base, wherein a first layer of synthetic diamond is at least partially disposed on top of said at least one transistor; and
    wherein said package base comprises synthetic diamond.

8. The RF amplifier module of claim 7, wherein said substrate is characterized by a thickness between 50 μm and 300 μm.

9. The RF amplifier module of claim 7, wherein said first layer of synthetic diamond is characterized by an average value of thermal conductivity greater than 1000 W/mK.

10. The RF amplifier module of claim 7, wherein said epilayer comprises a two-dimensional electron gas layer positioned no further than 150-nm from said substrate.

11. The RF amplifier module of claim 7, wherein said transistor is an AlGaN/GaN high-electron mobility transistor.

12. The RF amplifier module of claim 7, further comprising a multiplicity of parallel transistor gates disposed on said transistor, wherein an average separation between said gates in the direction perpendicular to said gates is less than 25 μm.

13. A high-power RF transmitter comprising:
    a system housing,
    at least one RF amplifier module comprising:
        a package,
        at least one input port, at least one output port,
        at least one RF amplifier chip attached to said package, said RF amplifier chip comprising at least one transistor comprising an epilayer overlying a substrate, wherein said substrate comprises a first layer of synthetic diamond characterized by an average value of thermal conductivity, and wherein said RF amplifier chip comprises a second layer of synthetic diamond disposed adjacent to said at least one transistor,
        an RF power combiner coupled to said output port, and
        a heat conducting element.

14. The RF transmitter module of claim 13, wherein said substrate is characterized by a thickness between 50 μm and 300 μm.

15. The RF transmitter module of claim 13, wherein said average diamond thermal conductivity is greater than 1000 W/mK.

16. The RF transmitter module of claim 13, wherein said epilayer comprises a layer comprising an alloy of aluminum, gallium, and nitrogen.

17. The RF transmitter module of claim 13, wherein said RF power combiner comprises an electromagnetic waveguide.

18. The RF amplifier module of claim 13, wherein said transistor is an AlGaN/GaN high-electron mobility transistor.

19. The RF amplifier module of claim 13, further comprising a multiplicity of parallel transistor gates disposed on said transistor, wherein an average separation between said gates in the direction perpendicular to said gates is less than 25 μm.

20. The RF amplifier module of claim 13, wherein said epilayer comprises a two-dimensional electron gas layer positioned no further than 150 nm from said substrate.

* * * * *